(12) United States Patent
Lin et al.

(10) Patent No.: US 11,467,041 B2
(45) Date of Patent: Oct. 11, 2022

(54) THERMAL SENSOR INTEGRATED CIRCUIT, RESISTOR USED IN THERMAL SENSOR AND METHOD FOR DETECTING TEMPERATURE

(71) Applicant: MEDIATEK INC., Hsin-Chu (TW)

(72) Inventors: Ta-Hsin Lin, Hsinchu (TW); Jyun-Jia Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 1045 days.

(21) Appl. No.: 16/149,151

(22) Filed: Oct. 2, 2018

(65) Prior Publication Data

US 2019/0204163 A1 Jul. 4, 2019

Related U.S. Application Data

(60) Provisional application No. 62/613,443, filed on Jan. 4, 2018.

(51) Int. Cl.
| | |
|---|---|
| *G01K 7/24* | (2006.01) |
| *H01L 23/522* | (2006.01) |
| *H01L 23/532* | (2006.01) |
| *G01K 7/34* | (2006.01) |
| *H01L 49/02* | (2006.01) |

(Continued)

(52) U.S. Cl.
CPC ............. *G01K 7/24* (2013.01); *G01K 7/183* (2013.01); *G01K 7/186* (2013.01); *G01K 7/206* (2013.01); *G01K 7/34* (2013.01); *H01L 23/34* (2013.01); *H01L 23/528* (2013.01); *H01L 23/5228* (2013.01); *H01L 23/53228* (2013.01); *H01L 28/20* (2013.01)

(58) Field of Classification Search
CPC ............. H01L 23/53228; H01L 23/34; H01L 23/5228; H01L 23/528; H01L 28/20; H01L 23/647; G01K 7/24; G01K 7/183; G01K 7/186; G01K 7/206; G01K 7/34; G01K 7/25; H01C 7/021
See application file for complete search history.

(56) References Cited

U.S. PATENT DOCUMENTS

| | | | | |
|---|---|---|---|---|
| 4,571,095 A | * | 2/1986 | Stoffels | G01K 7/20 374/167 |
| 4,795,498 A | | 1/1989 | Germanton | |

(Continued)

FOREIGN PATENT DOCUMENTS

| | | |
|---|---|---|
| CN | 100492428 C | 5/2009 |
| CN | 102156004 A | 8/2011 |

(Continued)

*Primary Examiner* — Lisa M Caputo
*Assistant Examiner* — Janice M Soto
(74) *Attorney, Agent, or Firm* — Winston Hsu

(57) ABSTRACT

The present invention provides a thermal sensor integrated IC having a resistor and a converting circuit. The resistor is implemented by at least one metal line, wherein a resistance of the resistor is varied with a temperature of the resistor, the resistor has a first terminal and a second terminal, and one of the first terminal and the second terminal is arranged to provide a voltage signal corresponding to the resistance. The converting circuit is coupled to the resistor, and is configured to convert the voltage signal to an output signal for determining the temperature. In one embodiment, the at least one metal line is made by copper.

10 Claims, 7 Drawing Sheets

(51) Int. Cl.
    *H01L 23/528*     (2006.01)
    *G01K 7/20*     (2006.01)
    *G01K 7/18*     (2006.01)
    *H01L 23/34*     (2006.01)

(56) References Cited

U.S. PATENT DOCUMENTS

| | | | |
|---|---|---|---|
| 10,564,049 B2 * | 2/2020 | Xue | G01K 7/186 |
| 2004/0008754 A1 | 1/2004 | Clabes | |
| 2013/0334646 A1 * | 12/2013 | Chen | H01L 27/0207 |
| | | | 257/E27.008 |
| 2015/0285691 A1 * | 10/2015 | Caffee | G01K 7/24 |
| | | | 374/184 |

FOREIGN PATENT DOCUMENTS

| | | |
|---|---|---|
| CN | 103248320 A | 8/2013 |
| CN | 103512674 A | 1/2014 |
| CN | 104143981 A | 11/2014 |
| CN | 104299408 A | 1/2015 |
| CN | 105489519 A | 4/2016 |
| CN | 205679328 U | 11/2016 |
| CN | 106441625 A | 2/2017 |
| CN | 206056815 U | 3/2017 |
| JP | 2014-187065 A | 10/2014 |
| TW | I393869 | 4/2013 |
| WO | 2016/138840 A1 | 9/2016 |

* cited by examiner

THERMAL SENSOR INTEGRATED CIRCUIT, RESISTOR USED IN THERMAL SENSOR AND METHOD FOR DETECTING TEMPERATURE

CROSS REFERENCE TO RELATED APPLICATIONS

This application claims the priority of U.S. Provisional Application No. 62/613,443, filed on Jan. 4, 2018, which is included herein by reference in its entirety.

BACKGROUND

The conventional thermal sensor generally has a bipolar junction transistor (BJT) for temperature sensing. Because a supply voltage is decreased due to the advanced semiconductor process, a charge pump circuit is built in the thermal sensor to make the BJT function well. However, the charge pump circuit may greatly increase the chip area.

SUMMARY

It is therefore an objective of the present invention to provide a thermal sensor having a metal line serving as a thermistor for determining the temperature, and the thermal sensor does not have any BJT for temperature sensing, to solve the above-mentioned problems.

According to one embodiment of the present invention, a thermal sensor integrated circuit (IC) comprises a resistor and a converting circuit. The resistor is implemented by at least one metal line, wherein a resistance of the resistor is varied with a temperature of the resistor, the resistor has a first terminal and a second terminal, and one of the first terminal and the second terminal is arranged to provide a voltage signal corresponding to the resistance. The converting circuit is coupled to the resistor, and is configured to convert the voltage signal to an output signal for determining the temperature.

According to another embodiment of the present invention, a resistor used in a thermal sensor is provided, wherein the resistor is implemented by at least one metal line, a resistance of the resistor is varied with a temperature of the resistor, and the resistor is arranged to provide a voltage signal corresponding to the resistance for determining the temperature.

According to another embodiment of the present invention, a method for detecting a temperature is provided, wherein the method comprises the steps of: using a resistor serving as a thermistor to provide a voltage signal corresponding to a resistance of the resistor, wherein the resistor is implemented by at least one metal line made by copper; and converting the voltage signal to an output signal for determining the temperature.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
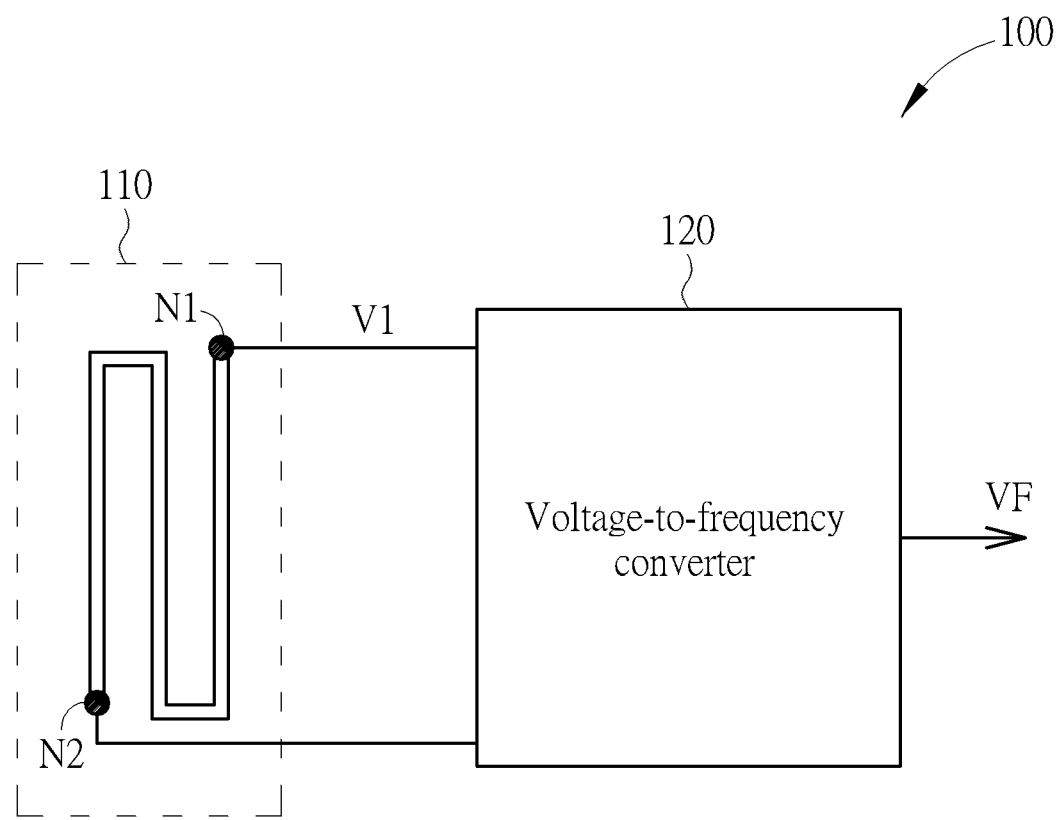
FIG. 1 is a diagram illustrating a thermal sensor according to one embodiment of the present invention.

FIG. 1 is a diagram illustrating a thermal sensor 100 according to one embodiment of the present invention. As shown in FIG. 1, the thermal sensor 100 is a thermal sensor IC, and the thermal sensor 100 comprises a resistor 110 and a voltage-to-frequency converter 120. In this embodiment, the resistor 110 is implemented by at least one metal line, and the metal line serves as a thermistor whose resistance is varied with a temperature. In the operations of the thermal sensor 100, the resistor 110 has a first terminal N1 and a second terminal N2, one of the first terminal N1 and the second terminal N2 is arranged to provide a voltage signal V1 corresponding to the resistance (FIG. 1 shows the first terminal N1 provides the voltage signal V1), and the voltage-to-frequency converter 120 converts the voltage signal V1 to a frequency signal VF for determining the temperature.

The conventional resistor built in the IC is made by Titanium Nitride (TiN) or other materials whose temperature coefficient of resistance (i.e., the resistance change factor per degree of temperature change) is small, so the conventional thermal sensor IC generally uses the BJT, instead of using the resistor, to sense the temperature due to the smaller temperature coefficient and poor linearity of the conventional resistor. In the embodiment of the present invention, the resistor 110 is made by copper (main material) having higher temperature coefficient of resistance to solve this problem, and the thermal sensor 100 does not have the BJT and related charge pump circuit having large chip area.

Figure 2:
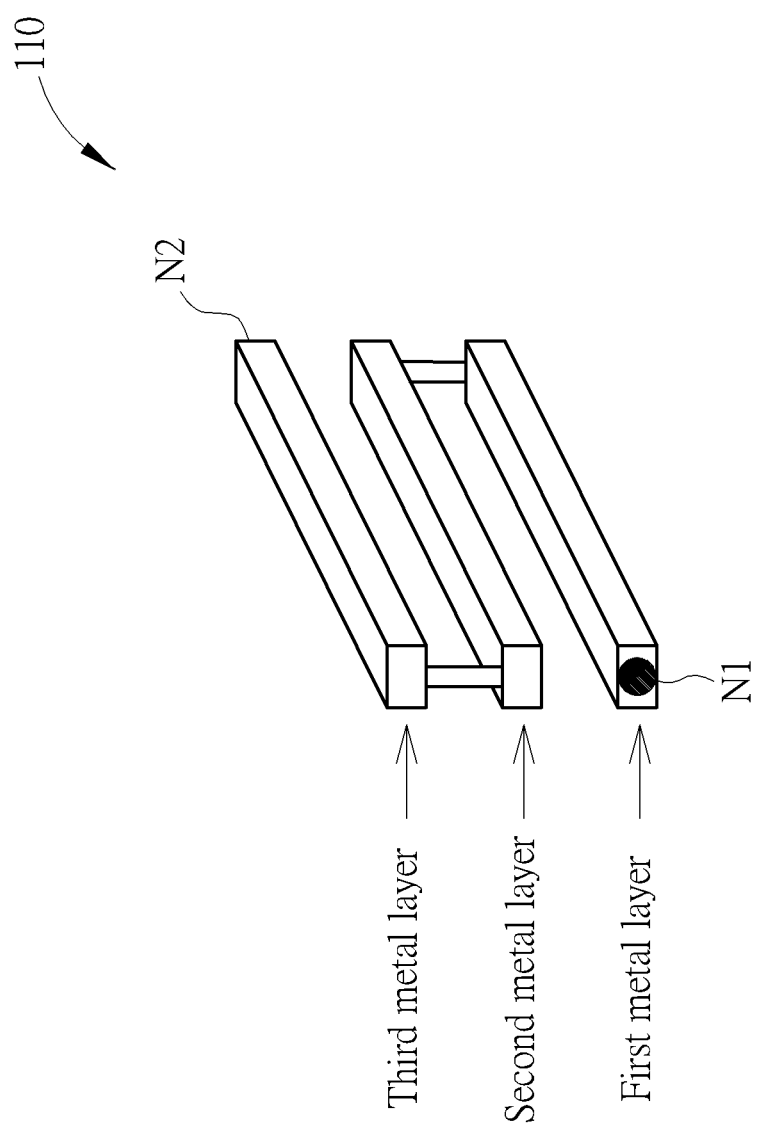
FIG. 2 is a diagram illustrating the resistor according to a first embodiment of the present invention.

The resistivity of the copper is small, so the conventional art does not use the copper to implement the thermistor. Therefore, to make the resistor 110 function properly in the thermal sensor 100, the resistor 110 may be implemented by the metal line whose length is longer to increase the resistance. FIG. 2 is a diagram illustrating the resistor 110 according to a first embodiment of the present invention. As shown in FIG. 2, the resistor 110 comprises three metal lines manufactured by copper processes and metalized at different metal layers (i.e. the first metal layer, the second metal layer and the third metal layer shown in FIG. 2), and the plurality of metal lines manufactured on the different metal layers are connected together to form a single metal line. It is noted that the quantity of the metal layers shown in FIG. 2 is for illustrative purposes only, and it is not a limitation of the present invention.

Figure 3:
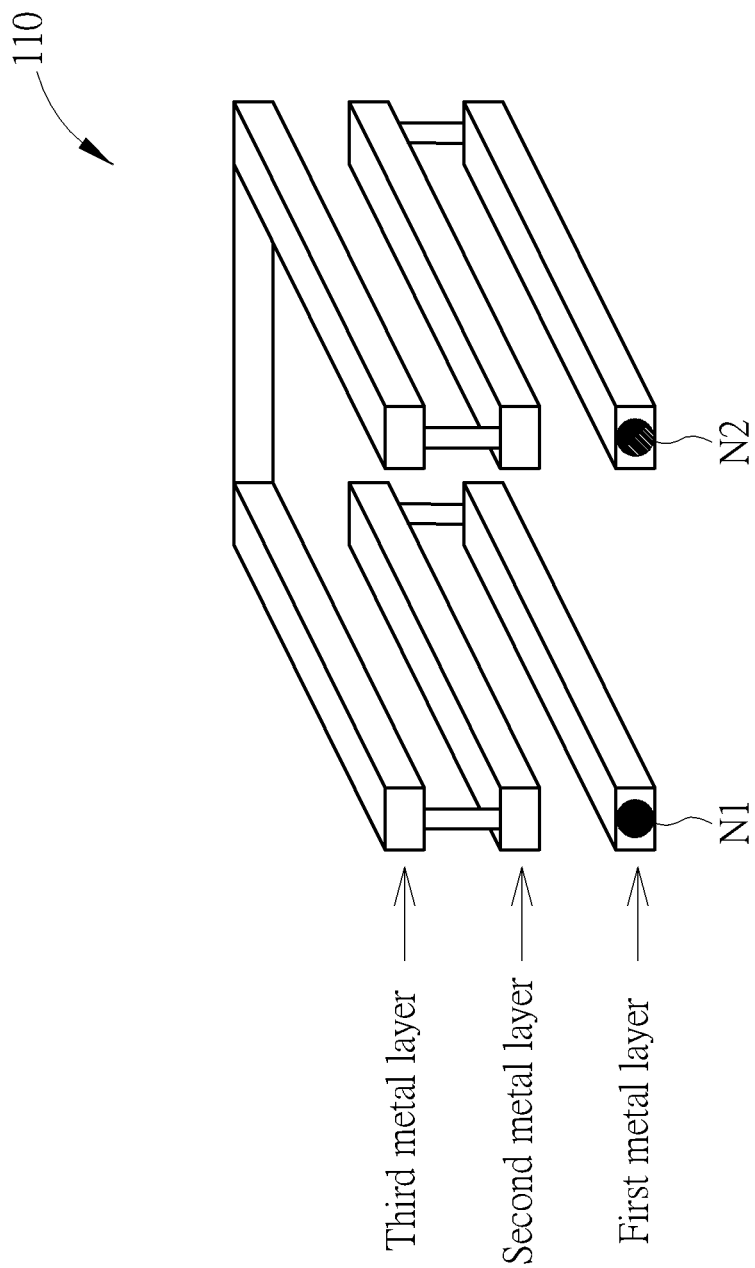
FIG. 3 is a diagram illustrating the resistor according to a second embodiment of the present invention.

FIG. 3 is a diagram illustrating the resistor 110 according to a second embodiment of the present invention. As shown in FIG. 3, the resistor 110 comprises three metal lines manufactured by copper processes and metalized at different metal layers (i.e. the first metal layer, the second metal layer and the third metal layer shown in FIG. 3), the U-shaped metal line can increase the length/resistance, and the plurality of metal lines manufactured on the different metal layers are connected together to form a single metal line. It is noted that the quantity of the metal layers shown in FIG. 3 is for illustrative purposes only, and it is not a limitation of the present invention.

Figure 4:
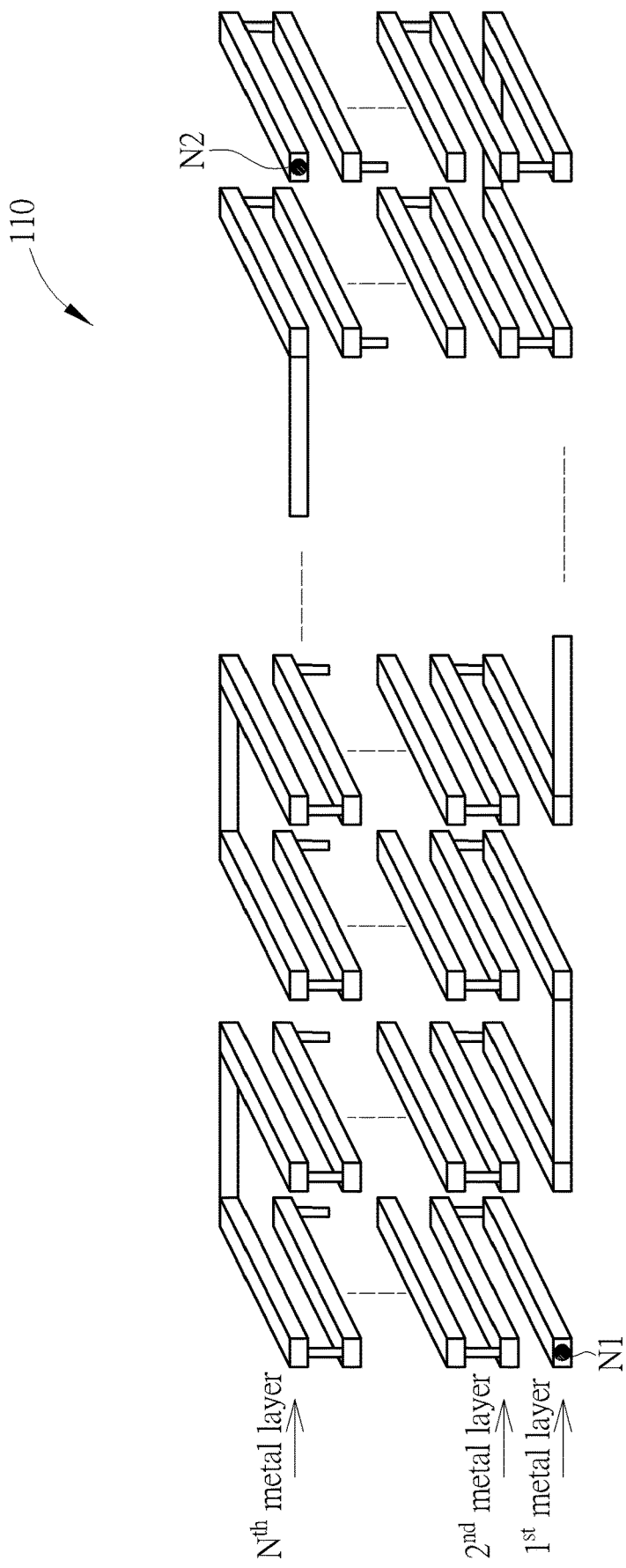
FIG. 4 is a diagram illustrating the resistor according to a third embodiment of the present invention.

FIG. 4 is a diagram illustrating the resistor 110 according to a third embodiment of the present invention. As shown in FIG. 4, the resistor 110 comprises a plurality of metal line groups, each metal line group has a plurality of metal lines manufactured by copper processes and metalized at N different metal layers, the metal lines within one metal line group may have different shapes (e.g. U-shaped metal line and line-shaped metal line shown in FIG. 4), and the plurality of metal lines manufactured on the different metal layers are connected together to form a single metal line. It is noted that the quantity of the metal layers shown in FIG. 4 is for illustrative purposes only, and it is not a limitation of the present invention.

Figure 5:
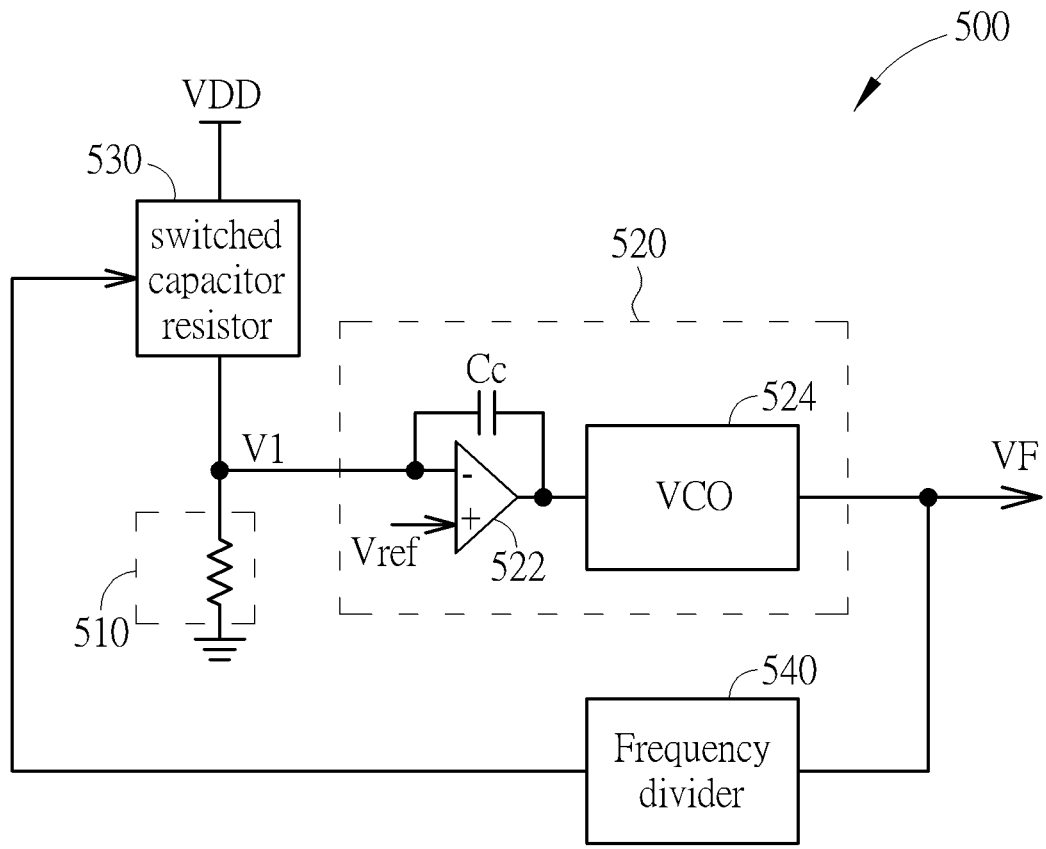
FIG. 5 is a diagram illustrating a thermal sensor according to another embodiment of the present invention.

FIG. 5 is a diagram illustrating a thermal sensor 500 according to another embodiment of the present invention. As shown in FIG. 5, the thermal sensor 500 is a thermal sensor IC, and the thermal sensor 500 comprises a resistor 510, a voltage-to-frequency converter 520, a switched-capacitor resistor 530 and a frequency divider 540, wherein the voltage-to-frequency converter 520 comprises an integrator formed by an operational amplifier 522 and a capacitor Cc, and a voltage-controlled oscillator (VCO) 524. In this embodiment, the resistor 510 can be the resistor 110 shown in FIGS. 1-4, that is the resistor 510 is implemented by at least one metal line manufactured by copper.

In the operations of the thermal sensor 500, the resistor 510 and the switched-capacitor resistor 530 forms a voltage divider, and a voltage signal V1 is generated at an upper terminal of the resistor 510. The operational amplifier 522 receives the voltage signal V1 and a reference voltage Vref to generate a control signal to control the VCO 524 to generate the frequency signal VF. The frequency divider 540 divides the frequency signal VF to generate a feedback signal to turn on/off the switched-capacitor resistor 530 to adjust a resistance of the switched-capacitor resistor 530. In one embodiment, the reference voltage Vref is half of a supply voltage VDD, and the voltage signal V1 should be equal to the reference voltage Vref in the steady state (i.e., the resistances of the resistor 510 and the switched-capacitor resistor 530 are the same). That is, when the resistance of the resistor 510 is varied due to the change of the temperature, the voltage signal V1 may be varied to trigger the voltage-to-frequency converter 520 to adjust the frequency signal VF, to make the resistance of the switched-capacitor resistor 530 equal to the resistance of the resistor 510. Therefore, by referring to the frequency signal VF, the temperature can be determined.

Figure 6:
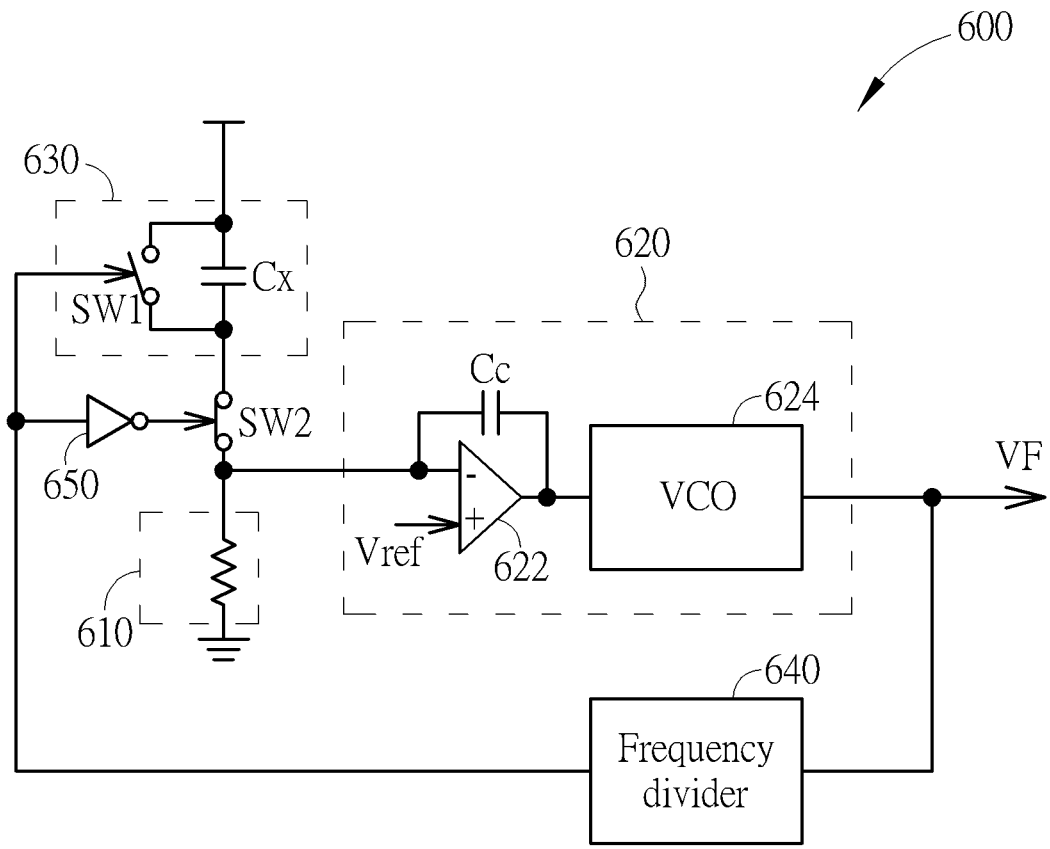
FIG. 6 is a diagram illustrating a thermal sensor according to another embodiment of the present invention.

FIG. 6 is a diagram illustrating a thermal sensor 600 according to another embodiment of the present invention. As shown in FIG. 6, the thermal sensor 600 is a thermal sensor IC, and the thermal sensor 600 comprises a resistor 610, a voltage-to-frequency converter 620, a switched-capacitor resistor 630, a frequency divider 640, an inverter 650 and a switch SW2, wherein the voltage-to-frequency converter 620 comprises an integrator formed by an operational amplifier 622 and a capacitor Cc, and a voltage-controlled oscillator (VCO) 624; and the switched-capacitor resistor 630 comprises a switch SW1 and a capacitor Cx connected in parallel. In this embodiment, the resistor 610 can be the resistor 110 shown in FIGS. 1-4, that is the resistor 610 is implemented by at least one metal line manufactured by copper.

In the operations of the thermal sensor 600, the resistor 610 and the switched-capacitor resistor 630 forms a voltage divider, and a voltage signal V1 is generated at an upper terminal of the resistor 610. The operational amplifier 622 receives the voltage signal V1 and a reference voltage Vref to generate a control signal to control the VCO 624 to generate the frequency signal VF. The frequency divider 640 divides the frequency signal VF to generate a feedback signal to turn on/off the switch SW1 to adjust a resistance of the switched-capacitor resistor 630, and the switch SW2 is controlled by the feedback signal via the inverter 650. In one embodiment, the reference voltage Vref is half of a supply voltage VDD, and the voltage signal V1 should be equal to the reference voltage Vref in the steady state (i.e. the resistances of the resistor 610 and the switched-capacitor resistor 630 are the same). That is, when the resistance of the resistor 610 is varied due to the change of the temperature, the voltage signal V1 may be varied to trigger the voltage-to-frequency converter 620 to adjust the frequency signal VF, to make the resistance of the switched-capacitor resistor 630 equal to the resistance of the resistor 610. In this embodiment, the resistance of the resistor 610 and the frequency signal VF have the following relationship:

$$\frac{VDD}{\left(\frac{VDD}{2}\right)} = \frac{RM + RSW}{RM} = \frac{RM + \frac{1}{F1 \cdot Cx}}{RM} = 1 + \frac{1}{F1 \cdot RM \cdot Cx}.$$

$$RM \cdot Cx = \frac{1}{F1},$$

Wherein "RM" is the resistance of the resistor 610, "RSW" is the resistance of the switched-capacitor resistor 630, "F1" is the frequency of the frequency signal VF. Therefore, by referring to the frequency signal VF, the resistance of the resistor 610 is known, and the temperature can be determined accordingly.

Figure 7:
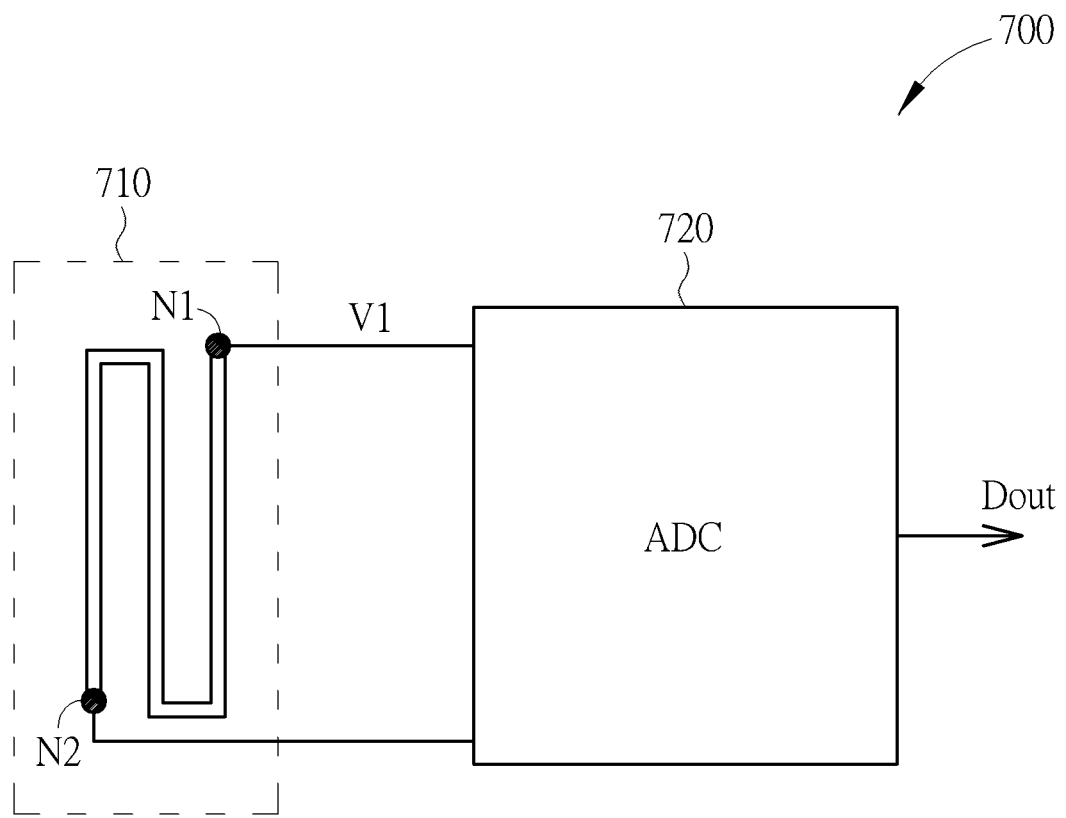
FIG. 7 is a diagram illustrating a thermal sensor according to another embodiment of the present invention.

FIG. 7 is a diagram illustrating a thermal sensor 700 according to another embodiment of the present invention. As shown in FIG. 7, the thermal sensor 700 is a thermal sensor IC, and the thermal sensor 700 comprises a resistor 710 and an analog-to-digital converter 720. In this embodiment, the resistor 710 can be the resistor 110 shown in FIGS. 1-4, that is the resistor 610 is implemented by at least one metal line manufactured by copper. In the operations of the thermal sensor 700, the resistor 710 has a first terminal N1 and a second terminal N2, one of the first terminal N1 and the second terminal N2 is arranged to provide a voltage signal V1 corresponding to the resistance (FIG. 7 shows the first terminal N1 provides the voltage signal V1), and the analog-to-digital converter 720 converts the voltage signal V1 to a digital code Dout. Because the voltage signal V1 can represent the resistance of the resistor 710, by referring to the digital code Dout corresponding to the voltage signal V1, the resistance of the resistor 710 can be known, and the temperature can be determined accordingly.

Briefly summarized, in the thermal sensor of the present invention, a metal line made by copper serves as the thermistor to provide a voltage signal for determining the temperature. Therefore, the thermal sensor does not need the BJT and the related charge pump circuit, and the chip area can be greatly reduced. In addition, because the copper has the suitable temperature coefficient, the thermal sensor can function well and have better linearity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thermal sensor integrated circuit (IC), comprising:
   a resistor implemented by at least one metal line, wherein a resistance of the resistor is varied with a temperature of the resistor, the resistor has a first terminal and a second terminal, and one of the first terminal and the second terminal is arranged to provide a voltage signal corresponding to the resistance;
   a switched-capacitor resistor, coupled between a supply voltage and the first terminal of the resistor; and
   a converting circuit, coupled to the resistor, for converting the voltage signal to an output signal for determining the temperature, wherein the converting circuit is a voltage-to-frequency converter, and the voltage-to-frequency converter converts the voltage signal to a frequency signal for determining the temperature and controlling the switched-capacitor resistor.

2. The thermal sensor IC of claim 1, wherein the at least one metal line is made by copper.

3. The thermal sensor IC of claim 2, wherein the at least one metal line comprises a plurality of metal lines, and the metal lines are made by copper and metalized at different metal layers.

4. The thermal sensor IC of claim 3, wherein the plurality of metal lines manufactured on the different metal layers are connected together to form a single metal line serving as the resistor.

5. The thermal sensor IC of claim 1, wherein the thermal sensor IC does not comprise any bipolar junction transistor (BJT) for temperature sensing.

6. The thermal sensor IC of claim 1, further comprising:
   a frequency divider, coupled to the voltage-to-frequency converter and the switched-capacitor resistor, for frequency-dividing the frequency signal to generate a feedback signal to control the switched-capacitor resistor.

7. The thermal sensor IC of claim 6, further comprising:
   a switch coupled between the switched-capacitor resistor and the first terminal of the resistor, wherein the switch is controlled by the feedback signal.

8. A method for detecting a temperature, comprising:
   using a resistor serving as a thermistor to provide a voltage signal corresponding to a resistance of the resistor, wherein the resistor is implemented by at least one metal line made by copper;
   providing a switched-capacitor resistor coupled between a supply voltage and the first terminal of the resistor; and
   converting the voltage signal to a frequency signal for determining the temperature and controlling the switched-capacitor resistor.

9. The method of claim 8, wherein the at least one metal line comprises a plurality of metal lines, and the metal lines are made by copper and metalized at different metal layers.

10. The method of claim 9, wherein the plurality of metal lines manufactured on the different metal layers are connected together to form a single metal line serving as the resistor.

* * * * *